(12) United States Patent
Chuang et al.

(10) Patent No.: US 9,356,058 B2
(45) Date of Patent: May 31, 2016

(54) BACKSIDE STRUCTURE FOR BSI IMAGE SENSOR

(75) Inventors: Chun-Chieh Chuang, Tainan (TW);
Dun-Nian Yaung, Taipei (TW);
Jen-Cheng Liu, Hsin-Chu (TW);
Wen-De Wang, Minsyong Township (TW); Keng-Yu Chou, Kaohsiung (TW); Shuang-Ji Tsai, Tainan (TW);
Min-Feng Kao, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 253 days.

(21) Appl. No.: 13/597,007

(22) Filed: Aug. 28, 2012

(65) Prior Publication Data

US 2013/0299931 A1 Nov. 14, 2013

Related U.S. Application Data

(60) Provisional application No. 61/645,384, filed on May 10, 2012.

(51) Int. Cl.
*H01L 21/311* (2006.01)
*H01L 27/146* (2006.01)

(52) U.S. Cl.
CPC ........ *H01L 27/1462* (2013.01); *H01L 27/1464* (2013.01); *H01L 27/14685* (2013.01)

(58) Field of Classification Search
CPC ............ H01L 27/1462; H01L 27/1464; H01L 27/14685; H01L 27/3244; H01L 31/18; H01L 31/0232; H01L 31/02327; H01L 51/5253
See application file for complete search history.

(56) References Cited

U.S. PATENT DOCUMENTS

| | | | |
|---|---|---|---|
| 8,709,854 B2 | 4/2014 | Chuang et al. | |
| 8,969,991 B2 | 3/2015 | Chuang et al. | |
| 2003/0032260 A1* | 2/2003 | Ahn et al. | 438/443 |
| 2004/0021939 A1* | 2/2004 | Kobayashi | 359/443 |
| 2005/0122417 A1* | 6/2005 | Suzuki | 348/340 |
| 2009/0189235 A1* | 7/2009 | Ikeda et al. | 257/432 |
| 2009/0251573 A1* | 10/2009 | Toyoda | 348/273 |
| 2009/0283909 A1* | 11/2009 | Tsutsumi et al. | 257/751 |

(Continued)

FOREIGN PATENT DOCUMENTS

| | | |
|---|---|---|
| JP | 2009-252949 | 10/2009 |
| JP | 2011151126 | 8/2011 |

(Continued)

*Primary Examiner* — Fei Fei Yeung Lopez
(74) *Attorney, Agent, or Firm* — Slater Matsil, LLP

(57) ABSTRACT

An embodiment method for forming an image sensor includes forming an anti-reflective coating over a surface of a semiconductor supporting a photodiode, forming an etching stop layer over the anti-reflective coating, forming a buffer oxide over the etching stop layer, and selectively removing a portion of the buffer oxide through etching, the etching stop layer protecting the anti-reflective coating during the etching. An embodiment image sensor includes a semiconductor disposed in an array region and in a periphery region, the semiconductor supporting a photodiode in the array region, an anti-reflective coating disposed over a surface of the semiconductor, an etching stop layer disposed over the anti-reflective coating, a thickness of the etching stop layer over the photodiode in the array region less than a thickness of the etching stop layer in the periphery region, and a buffer oxide disposed over the etching stop layer in the periphery region.

20 Claims, 4 Drawing Sheets

(56) References Cited

U.S. PATENT DOCUMENTS

| | | |
|---|---|---|
| 2010/0201834 A1 | 8/2010 | Maruyama et al. |
| 2010/0244173 A1 | 9/2010 | Wang et al. |
| 2010/0304520 A1* | 12/2010 | Hiyama .......................... 438/69 |
| 2011/0164159 A1 | 7/2011 | Ohgishi |
| 2011/0175187 A1 | 7/2011 | Ueno et al. |
| 2012/0001286 A1 | 1/2012 | Yoon |
| 2012/0062777 A1 | 3/2012 | Kobayashi et al. |
| 2013/0207212 A1 | 8/2013 | Mao et al. |
| 2013/0299675 A1 | 11/2013 | Yamaguchi et al. |
| 2014/0252523 A1 | 9/2014 | Chuang et al. |
| 2015/0140722 A1 | 5/2015 | Chuang et al. |

FOREIGN PATENT DOCUMENTS

| | | |
|---|---|---|
| KR | 2010-0016308 | 2/2010 |
| KR | 20120028799 | 3/2012 |

\* cited by examiner

BACKSIDE STRUCTURE FOR BSI IMAGE SENSOR

CROSS-REFERENCE TO RELATED APPLICATIONS

This application claims the benefit of U.S. Provisional Application No. 61/645,384, filed on May 10, 2012, entitled "Backside Structure for BSI Image Sensor," which application is hereby incorporated herein by reference.

BACKGROUND

Bottom Anti-Reflective Coatings (BARC) are known in the art for improving photolithography processes. In Back Side Illumination (BSI) image sensors, various subsequent processing steps can damage a BARC film.

By way of example, if an etching process to remove an overlying buffer oxide layer continues into the BARC film, the BARC film may be damaged. The damage to the BARC film may undesirably induce a high leakage current in the image sensor.

As another example, if the etching process to remove the overlying buffer oxide layer stops prior to reaching the BARC film, some of the undesirably remain. The remaining buffer oxide may have an undesirable thickness and/or a poor uniformity, which may degrade the optical performance of the image sensor. In other words, the buffer oxide overlying the BSI image sensor array is not fully removed, the quality factor (QE) and/or signal to noise ratio (SNR) of the resulting sensor device can be degraded.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a Back Side Illumination (BSI) image sensor. The concepts in the disclosure may also apply, however, to other image sensors, semiconductor structures, or circuits.

Figure 1:
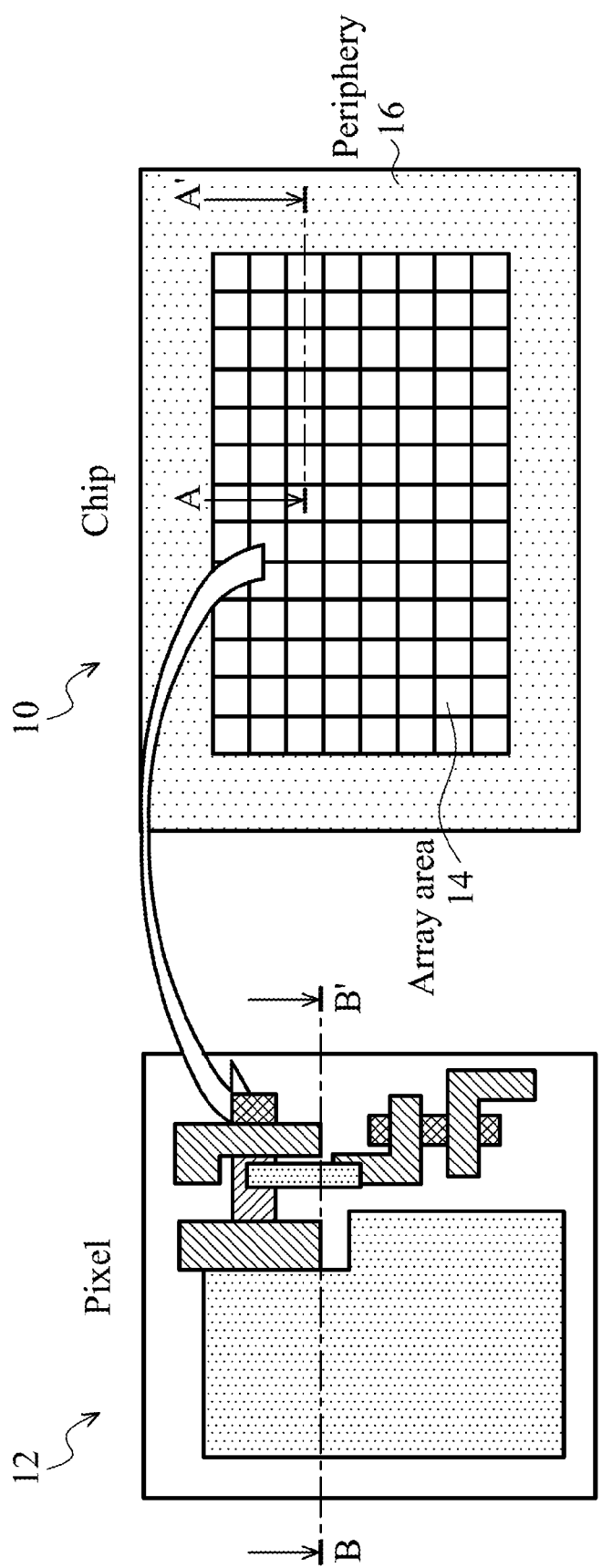
FIG. 1 illustrates in top down view an illustrative CMOS image sensor chip, including an illustrative pixel portion of the chip in greater detail.

Referring now to FIG. 1, a top down view of an illustrative image sensor chip 10, with an illustrative pixel portion 12 in greater detail, is shown. The image sensor chip 10 (i.e., an image sensor) generally includes a sensor array region 14 and a periphery region 16. As will be more fully explained below, it is desirable that the processing steps used to form the image sensor chip 10 include some variations between the sensor array region 14 and the periphery region 16. For example, while it is desirable to have a top buffer oxide layer and a metal shield layer overlying the backside of the periphery region 16, it is desirable that the buffer oxide and metal shield not overlie the backside of the sensor array region 14.

Figure 2A:
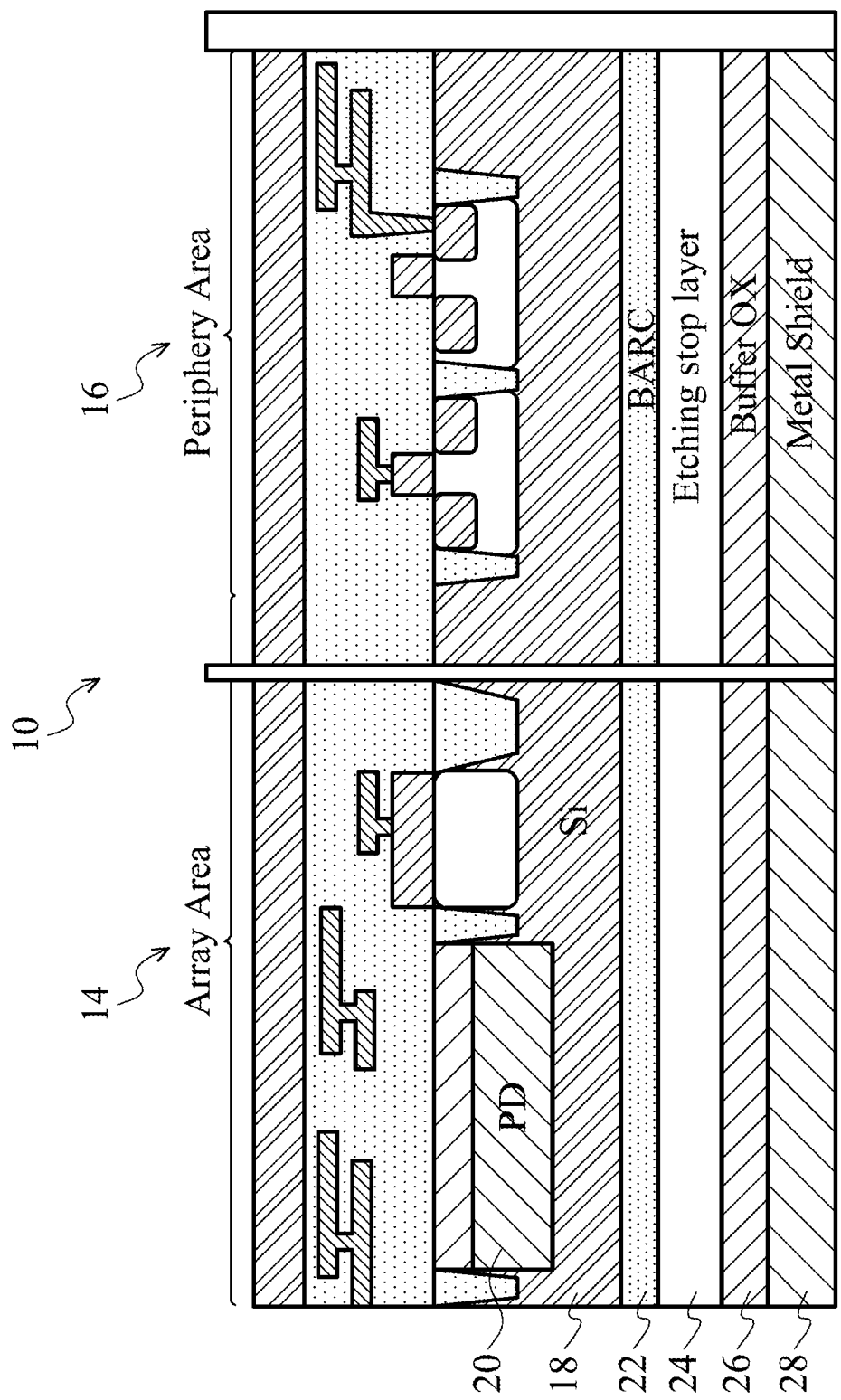
FIGS. 2a through 2c illustrate in cross sectional view illustrative process steps in the manufacture of an illustrative image sensor device.

Referring now to FIG. 2a, the sensor array region 14 and the periphery region 16 of the image sensor chip 10 are schematically illustrated in cross section at an intermediate stage of manufacture. As shown, a semiconductor 18 (e.g., silicon, etc.) generally supports or incorporates a photodiode 20 in the sensor array region 14 of the image sensor chip 10. The photodiode 20 is generally capable of converting light into either current or voltage, depending upon the mode of operation.

As shown in FIG. 2a, a bottom anti-reflective coating (BARC) 22 is formed over a surface of the semiconductor 18 (as used herein, the terms "over," "on," and the like are relative terms, regardless of whether the layers are being added to the nominal "top" of the device or to the nominal "bottom" of the device as illustrated in the various figures). As shown, the bottom anti-reflective coating 22 is formed within both the sensor array region 14 and the periphery region 16 of the image sensor chip 10. Because the bottom anti-reflective coating 22 is disposed over the photodiode 20 in the sensor array region 14, the reflection of incident light is reduced.

Still referring to FIG. 2a, an etching stop layer 24 is formed over the bottom anti-reflective coating 22. In an embodiment, silicon nitride (SiN), silicon carbide (SiC), silicon oxynitride (SiON), and combinations thereof are considered acceptable materials for the etching stop layer 24. Other materials could be employed as well, as would be known to those skilled in the art through routine experimentation once informed by the present disclosure. In an embodiment, the etching stop layer 24 and the bottom anti-reflective coating 22 are formed from the same or a similar material. In an embodiment, a refractive index value of the etching stop layer 24 is equivalent to a refractive index value of the bottom anti-reflective coating 22.

As shown in FIG. 2a, a buffer oxide (Buffer OX) layer 26 is formed over the etching stop layer 24. In an embodiment, the etching stop layer 24 has a higher etching selectivity relative to the buffer oxide layer 26. Indeed, in an embodiment an etching selectivity between the buffer oxide layer 26 and the etching stop layer 24 is in a range of about 3 to about 10. Once the buffer oxide layer 26 has been deposited or formed, a metal shield layer 28 may be added to the image sensor chip 10.

Figure 2B:
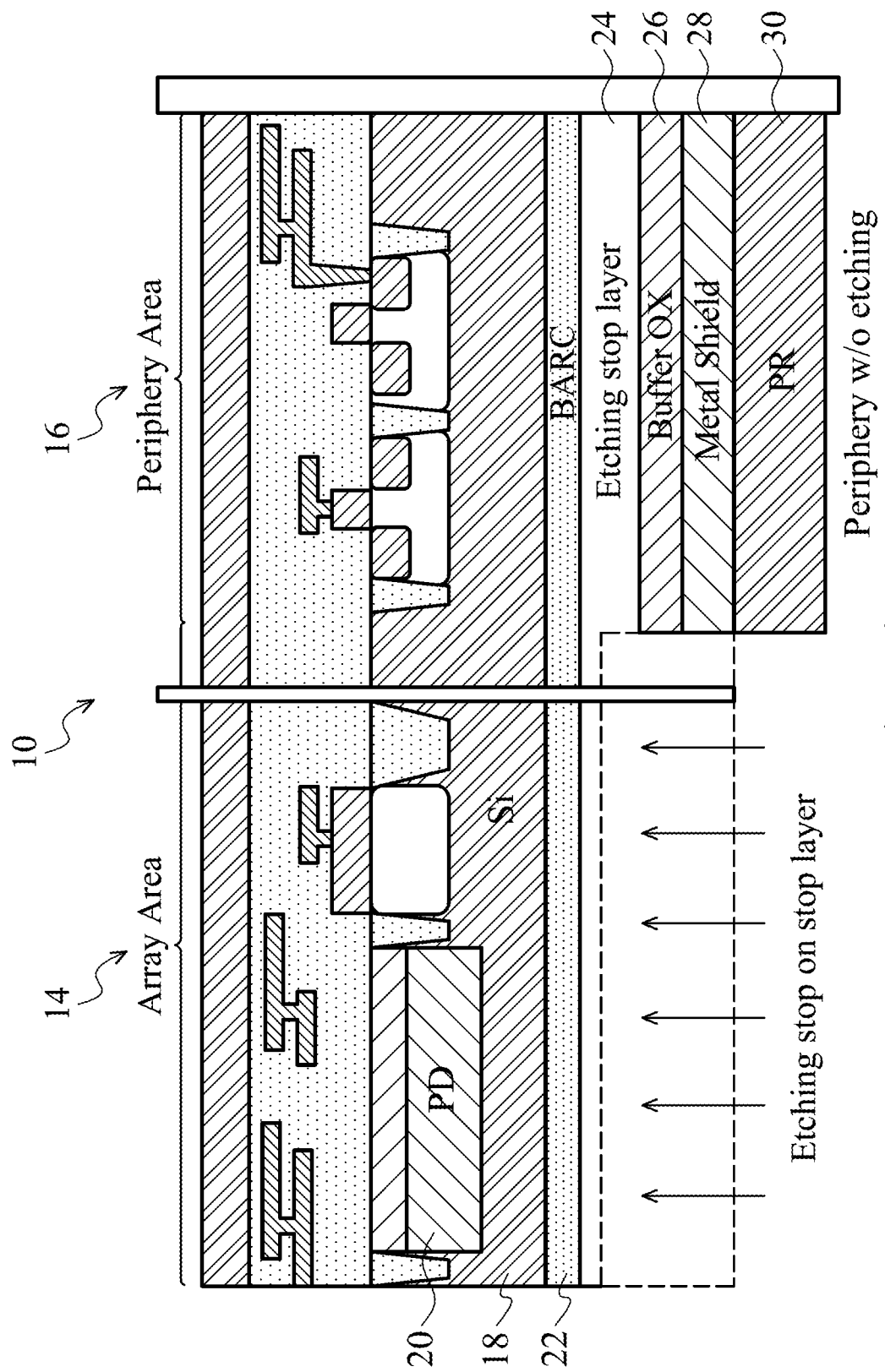

FIG. 2b schematically illustrates a process whereby the buffer oxide layer 26 and the metal shield 28 are selectively removed from the sensor array region 14 through an etch process. The etch process may be a wet etch process or a dry etch process, e.g., employing chemical etch, a plasma, ion bombardment, reactive ion etching, or the like. Different etch chemistries and processes will likely be used for the metal shield 28, relative the buffer oxide layer 26, as is known in the art. A mask 30, such as a photoresist layer, a hard mask, or the like, overlies the periphery region 16, thereby protecting and preventing the metal shield 28 and buffer oxide layer 26 from being etched away in that region.

As shown in FIG. 2b, in an embodiment the etch process consumes some of the etching stop layer 24 in the sensor array region 14. This is acceptable, provided the etching stop layer 24 is of appropriate material (having desirable etch selectivity relative the buffer oxide layer etchant) and/or thickness such that the underlying bottom anti-reflective coating 22 is protected from damage by the etch process. Notably, the etching stop layer 24 will not degrade the performance of the photodiode 20 and the image sensor chip 10 even if the etching stop layer 24 suffers damage during the etching process.

Figure 2C:
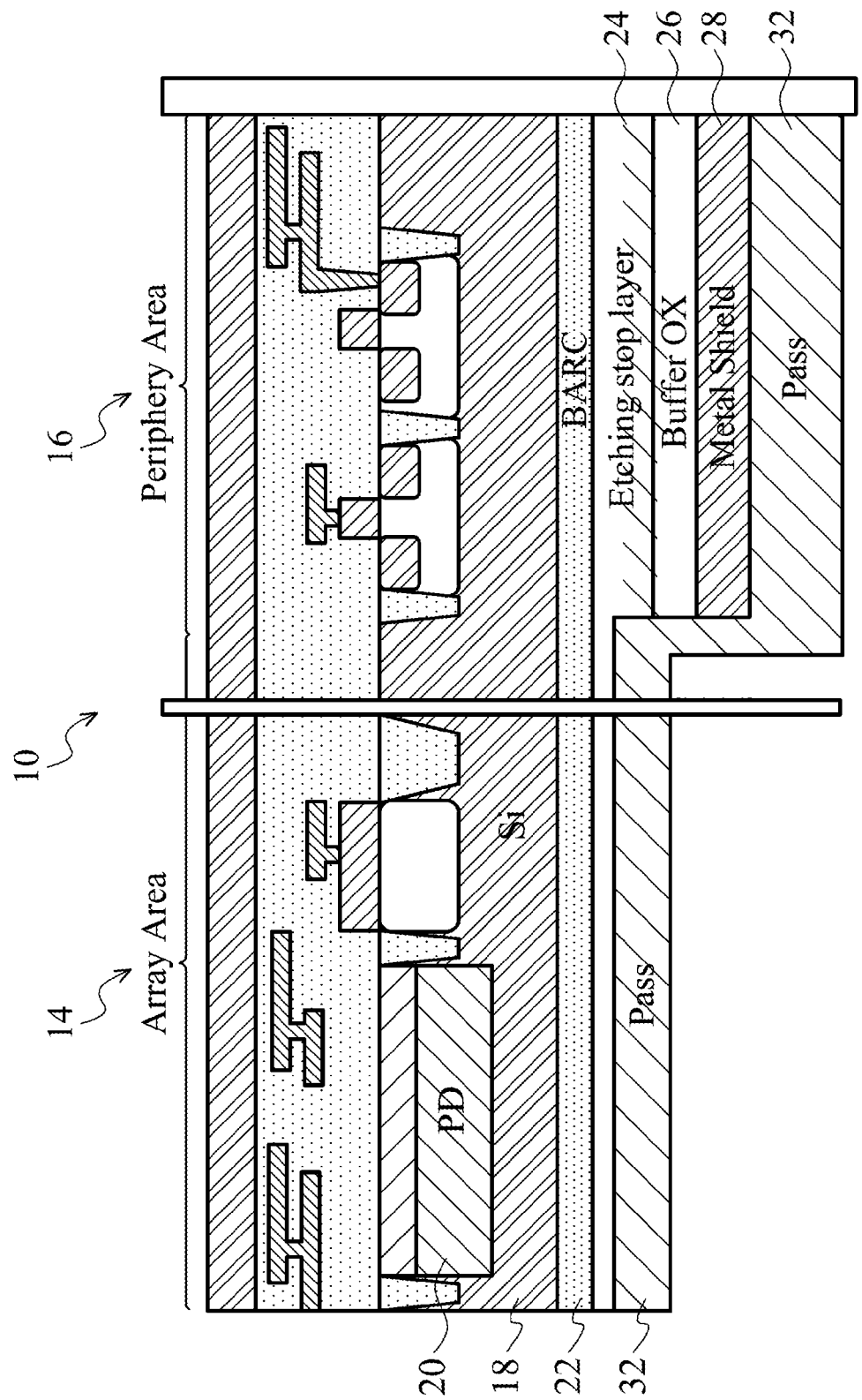

FIG. 2c illustrates formation of a passivation layer 32 (e.g., film) over the remaining portion of etching stop layer 24 in the sensor array region 14 and over the metal shield 28 in the periphery region 16 of the image sensor chip 10. Notably, the mask 30 from FIG. 2c has been removed prior to forming the passivation layer 32. In an embodiment, the etching stop layer 24 and the passivation layer 32 are formed from the same or a similar material. In an embodiment, a refractive index value of the etching stop layer 24 is between a refractive index value of the bottom anti-reflective coating 22 and a refractive index value of the passivation layer 32. Still referring to FIG. 2c, standard processes may be employed to complete the manufacturing process.

In general terms, the illustrated embodiments provide for a protection layer above the bottom anti-reflective coating 22, which protection layer acts as an etch stop layer, protecting the bottom anti-reflective coating 22 during subsequent processing steps. As such, the protection layer may be referred to herein as an etching stop layer 24 (or ESL).

It should be appreciated that embodiments disclosed herein provide for a relatively simple structure and easy process that nonetheless provides for improved dark current/signal-to-noise ratio (SNR) performance. The teachings provided herein can be readily applied to present and future generation processes for manufacturing image sensors.

In an embodiment, a method for forming an image sensor is provided. The method includes forming an anti-reflective coating over a surface of a semiconductor, the semiconductor supporting a photodiode, forming an etching stop layer over the anti-reflective coating, forming a buffer oxide over the etching stop layer, and selectively removing a portion of the buffer oxide through etching, the etching stop layer protecting the anti-reflective coating during the etching.

In an embodiment, a method for forming an image sensor is provided. The method includes forming an anti-reflective coating over a surface of a semiconductor, the semiconductor supporting a photodiode, forming an etching stop layer over the anti-reflective coating, forming a buffer oxide over the etching stop layer, forming a metal shield over the buffer oxide, disposing a photoresist over a portion of the metal shield to define a periphery region and an array region, the array region including the photodiode, and removing the metal shield and the buffer oxide in the array region through etching, the etching stop layer protecting the anti-reflective coating in the array region during the etching.

In an embodiment, an image sensor is provided. The image sensor includes a semiconductor disposed in an array region and in a periphery region, the semiconductor supporting a photodiode in the array region, an anti-reflective coating disposed over a surface of the semiconductor, an etching stop layer disposed over the anti-reflective coating, a thickness of the etching stop layer over the photodiode in the array region less than a thickness of the etching stop layer in the periphery region, and a buffer oxide disposed over the etching stop layer in the periphery region.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method for forming an image sensor, comprising:
    forming an anti-reflective coating over and in direct contact with a first semiconductor surface of a semiconductor, the semiconductor supporting a photodiode adjacent to a second surface of the semiconductor opposite the first surface of the semiconductor, wherein the anti-reflective coating is a single material with a constant thickness throughout the anti-reflective coating;
    forming an etching stop layer in direct physical contact with the single material;
    forming a buffer oxide over the etching stop layer; and
    selectively removing a portion of the buffer oxide through etching, the etching stop layer protecting the anti-reflective coating during the etching.

2. The method of claim 1, wherein a refractive index value of the etching stop layer is equivalent to a refractive index value of the anti-reflective coating.

3. The method of claim 1, wherein a passivation film is formed over the etching stop layer after the etching.

4. The method of claim 3, wherein a refractive index value of the etching stop layer is equivalent to a refractive index value of the passivation film.

5. The method of claim 3, wherein a refractive index value of the etching stop layer is between a refractive index value of the anti-reflective coating and a refractive index value of the passivation film.

6. The method of claim 1, wherein an etching selectivity of the etching stop layer is greater than an etching selectivity of the buffer oxide.

7. The method of claim 1, wherein the selectively removing includes removing the portion of the buffer oxide over the photodiode.

8. The method of claim 1, wherein the selectively removing includes removing the buffer oxide from a sensor array region of the image sensor without removing the buffer oxide from a periphery region of the image sensor.

9. The method of claim 1, further comprising forming a metal shield over the buffer oxide and selectively removing a portion of the metal shield over the photodiode during the etching process.

10. The method of claim 1, wherein the etching stop layer is selected from a group consisting essentially of silicon nitride (SiN), silicon carbide (SiC), and silicon oxynitride (SiON), and combinations thereof.

11. A method for forming an image sensor, comprising:
    forming an anti-reflective coating over and in direct contact with a surface of a semiconductor, wherein the anti-reflective coating is dielectric material throughout the anti-reflective coating and the semiconductor supporting a photodiode for a back-side image sensor;
    forming an etching stop layer over and in direct contact with the anti-reflective coating;
    forming a buffer oxide over and in direct contact with the etching stop layer;
    forming a metal shield over and in direct contact with the buffer oxide;
    disposing a mask over and in direct contact with a portion of the metal shield to define a periphery region and an array region, the array region including the photodiode; and
    removing the metal shield and the buffer oxide in the array region through etching, the etching stop layer protecting the anti-reflective coating in the array region during the etching.

12. The method of claim 11, further comprising forming a passivation film over the metal shield in the periphery region and over the etching stop layer in the array region, wherein the passivation film comprises a first material and the etching stop layer comprises the first material.

13. The method of claim 12, wherein a refractive index value of the etching stop layer is within a range defined by the refractive index value of the anti-reflective coating and the refractive index value of the passivation film, inclusive.

14. The method of claim 11, wherein an etching selectivity between the buffer oxide and the etching stop layer is in a range of about 3 to about 10.

15. The method of claim 11, wherein a portion of the etching stop layer in the array region is removed during the etching process.

16. The method of claim 11, wherein the etching process is performed without removing the buffer oxide and the metal shield from the periphery region.

17. A method for forming an image sensor, comprising:
providing a substrate, the substrate having an array area and a periphery area, the substrate having a photosensitive element along a first surface of the substrate in the array area;
forming an anti-reflective coating in direct physical contact with a second surface of the substrate, wherein the anti-reflective coating comprises a single material throughout the anti-reflective coating and the second surface is a surface of semiconductor material;
forming an etching stop layer in direct physical contact with the anti-reflective coating;
forming a buffer oxide layer over the etching stop layer, wherein the buffer oxide layer has a high etch selectivity relative to the etching stop layer;
forming a metal shield over the buffer oxide layer;
forming a patterned mask over the metal shield, the patterned mask exposing at least a portion of the array area; and
removing the metal shield from the array area.

18. The method of claim 17, further comprising forming a buffer oxide after the forming the etching stop layer and before the forming the metal shield, wherein the forming the metal shield comprises forming the metal shield on the buffer oxide.

19. The method of claim 17, wherein the removing the metal shield removes a portion of the etching stop layer.

20. The method of claim 17, further comprising removing at least a portion of the metal shield from the periphery area.

* * * * *